(12) United States Patent
Authelet et al.

(10) Patent No.: US 11,320,500 B2
(45) Date of Patent: May 3, 2022

(54) CRYOGENIC DEVICE FOR MAGNETIC RESONANCE IMAGERY SCANNER AND MAGNETIC RESONANCE IMAGERY ASSEMBLY COMPRISING SUCH CRYOGENIC DEVICE

(71) Applicants: COMMISSARIAT À L'ÉNERGIE ATOMIQUE ET AUX ÉNERGIES ALTERNATIVES, Paris (FR); UNIVERSITE PARIS-SACLAY, Orsay (FR)

(72) Inventors: Gilles Authelet, Gif-sur-Yvette (FR); Marie Poirier-Quinot, Orsay (FR); Bertrand Baudouy, Gif-sur-Yvette (FR)

(73) Assignees: COMMISSARIAT À L'ÉNERGIE ATOMIQUE ET AUX ÉNERGIES ALTERNATIVES, Paris (FR); UNIVERSITE PARIS-SACLAY, Gif-sur-Yvette (FR)

( * ) Notice: Subject to any disclaimer, the term of this patent is extended or adjusted under 35 U.S.C. 154(b) by 0 days.

(21) Appl. No.: 16/275,700

(22) Filed: Feb. 14, 2019

(65) Prior Publication Data
US 2020/0209329 A1      Jul. 2, 2020

Related U.S. Application Data

(60) Provisional application No. 62/785,907, filed on Dec. 28, 2018.

(51) Int. Cl.
G01R 33/34      (2006.01)
F25B 9/14       (2006.01)
(Continued)

(52) U.S. Cl.
CPC .......... *G01R 33/3403* (2013.01); *F25B 9/145* (2013.01); *G01R 33/34023* (2013.01);
(Continued)

(58) Field of Classification Search
CPC .......... G01R 33/34023; G01R 33/3403; G01R 33/543; G01R 33/31; G01R 33/3804;
(Continued)

(56) References Cited

U.S. PATENT DOCUMENTS 4,727,327 A * 2/1988 Toyoshima ............ G01R 33/28
324/309
5,694,775 A * 12/1997 Araoka .................. G01R 33/34
324/318

(Continued)

OTHER PUBLICATIONS

Lambert, Simon et al. "High-temperature superconducting radiofrequency probe for magnetic resonance imaging application operated below ambient pressure in a simple liquid-nitrogen cryostat" In: Review of Scientific Instrucments, 2013, vol. 84, 054701-1-054701-7.

(Continued)

*Primary Examiner* — Steven L Yeninas
(74) *Attorney, Agent, or Firm* — Pearne & Gordon LLP (57) ABSTRACT

A cryogenic device for cooling an RF coil of a Magnetic Resonance Imaging scanner. The cryogenic device includes: a cryocooler providing a cold source; a solid thermal link; the solid thermal link in thermal contact with the cryocooler; a RF coil holder for holding the RF coil, the RF coil holder being in thermal contact with thermal link; a vacuum chamber enclosing the solid thermal link and the RF-coil holder; a measurement surface, facing the RF coil holder; wherein each one of the cryocooler, the solid thermal link, the RF coil holder and the measurement surface is magnetic material free.

16 Claims, 4 Drawing Sheets

(51) Int. Cl.
*G01R 33/54* (2006.01)
*H01F 6/04* (2006.01)
*H01F 6/06* (2006.01)

(52) U.S. Cl.
CPC .............. *G01R 33/543* (2013.01); *H01F 6/04* (2013.01); *H01F 6/06* (2013.01)

(58) Field of Classification Search
CPC ....... G01R 33/3815; F25B 9/145; H01F 6/04; H01F 6/06
USPC .......................................................... 324/309
See application file for complete search history.

(56) References Cited

U.S. PATENT DOCUMENTS

| | | | | |
|---|---|---|---|---|
| 5,913,888 | A * | 6/1999 | Steinmeyer | F25B 9/145 |
| | | | | 62/259.2 |
| 7,288,939 | B1 * | 10/2007 | Barbara | G01R 33/31 |
| | | | | 324/318 |
| 8,283,923 | B2 * | 10/2012 | Tilmans | A61B 5/0555 |
| | | | | 324/307 |
| 10,107,881 | B2 * | 10/2018 | Lazar | G01R 33/3403 |
| 2004/0201433 | A1 | 10/2004 | Li et al. | |
| 2006/0022675 | A1 * | 2/2006 | Blank | G01R 33/60 |
| | | | | 324/316 |
| 2007/0139046 | A1 | 6/2007 | Haueisen et al. | |
| 2010/0066367 | A1 * | 3/2010 | Ma | G01R 33/34069 |
| | | | | 324/318 |
| 2010/0066368 | A1 * | 3/2010 | Gao | G01R 33/341 |
| | | | | 324/318 |
| 2011/0011102 | A1 * | 1/2011 | Gao | G01R 33/3403 |
| | | | | 62/51.1 |
| 2011/0015078 | A1 * | 1/2011 | Gao | G01R 33/3415 |
| | | | | 505/162 |
| 2012/0319690 | A1 * | 12/2012 | Ma | G01R 33/3403 |
| | | | | 324/322 |
| 2013/0063148 | A1 * | 3/2013 | Ma | G01R 33/3415 |
| | | | | 324/318 |
| 2014/0005523 | A1 * | 1/2014 | Kohler | G01R 33/4804 |
| | | | | 600/411 |
| 2014/0354277 | A1 * | 12/2014 | Dewdney | G01R 33/389 |
| | | | | 324/307 |
| 2018/0172791 | A1 * | 6/2018 | Boettcher | A61B 5/055 |

OTHER PUBLICATIONS

Authelet, G. et al., "Conceptual design of a cryogen-free μMRI device" In: IOP Conference Series: Material Science and Engineering, 2017, vol. 278 012122, No. 1, pp. 1-7.

Mudra, R. et al. "MRI CryoProbe" In: Bruker User Manual, Jul. 13, 2012.

"Closed Cycle 4K Flow System" In: The Stinger Cold Edge Technologies, 2017.

European Search Report for application No. EP 19157283 dated Sep. 16, 2019.

Nouls, John C. et al., "Design of a superconducting volume coil for magnetic resonance microscopy of the mouse brain" In: Journal of Magnetic Resonance, Jan. 5, 2008, vol. 191, No. 2 pp. 231-238.

* cited by examiner

CRYOGENIC DEVICE FOR MAGNETIC RESONANCE IMAGERY SCANNER AND MAGNETIC RESONANCE IMAGERY ASSEMBLY COMPRISING SUCH CRYOGENIC DEVICE

CROSS-REFERENCE TO RELATED APPLICATIONS

This application claims priority from application Ser. No. 62/785,907, filed Dec. 28, 2018, the entire contents of which are herewith incorporated by reference.

TECHNICAL DOMAIN

The invention relates to the domain of the Magnetic Resonance Imaging.

The invention is more specifically related to a cryogenic device for a magnetic resonance imaging scanner and to magnetic resonance imaging assembly comprising such cryogenic device.

PREVIOUS ART

Magnetic Resonance Imaging (MRI) is a noninvasive imaging technique, used on daily basis in medical practice to obtain functional and quantitative information. The sensitivity of detection in clinical routine allows obtaining images with a typical spatial resolution of the order of 1 $mm^3$.

In order to improve the MRI spatial resolution, one way to go is to increase the sensitivity of the Radio-Frequency (RF) probe used to detect the Nuclear Magnetic Resonance (NMR) signal. This can be achieved by diminishing the size of the probe and its electrical resistivity. In this perspective, miniaturized RF coil prototype has been conceived, based on a transmission line resonator, employing the high temperature superconductor $YBa_2Cu_3O_7$. Such high temperature superconductors are alloys with transition temperatures above 40K typically around 77K. Such RF coil required, that, during MRI measurement, the RF coil is maintained at a temperature lower than high critical temperature superconducting.

It thus necessary to use a specific set up to implement high critical temperature superconducting (HTcS) of the RF coil in the static magnetic field of the MRI.

It is known from the previous art two different solutions for such a specific set up:

(i) the use of a liquid nitrogen tank in which the RF coil is placed during the MRI measurement, (ii) the use a helium liquefaction system for achieving a 4.2 K temperature.

If solution (i) allows to achieve a 77 K temperature of the RF coil, this solution allows only to provide a reduced cooling surface and requires to refile regularly the liquid nitrogen tank. Furthermore, such solution required that the operator has knowledge on how to manipulate cryogenic liquids and that the oxygen content in the atmosphere is monitored.

Regarding solution (ii), if it allows to achieve a very low temperature of the RF coil, at most 4.2 K, it requires a cumbersome liquefaction loop that had to be installed away from the MRI unit and, consequently, needs a steel cryogenic line that link the liquefaction loop to a cryostat in such a way that cooling surface is also reduced. Furthermore, as solution (i), solution (ii) requires that the operator has knowledge how to manipulate cryogenic liquids since solution (ii) requires liquid helium in order to operate.

PRESENTATION OF THE INVENTION

So, it is an object of the invention to furnish a cryogenic device which allows to provide a low temperature cooling system for a RF coil used inside MRI scanner compatible with the MRI constraint and which is "cryogenist-free" device, i.e. a cryogen-free device working autonomously without the need of a cryogenic expert as it is the case for the device of the previous art.

The invention relates on a cryogenic device for cooling a RF coil for a Magnetic Resonance Imaging scanner, the cryogenic device comprising:

a cryocooler providing a cold source, a solid thermal link, the solid thermal link having a first end in thermal contact with the cryocooler, a RF coil holder for supporting the RF coil, the RF coil holder being in thermal contact with a second end of the thermal link opposite to the first end, a vacuum chamber enclosing the thermal link and the RF-coil support, a measurement support, facing the RF coil holder, wherein each one of the cryocooler, the thermal link and the RF coil holder is magnetic material free.

With such device it is possible to achieve the HTcS coil working conditions without perturbing the MRI measurement, since the cryocooler is away from the MRI scanner magnet, thanks to the solid thermal link and the vacuum chamber, and without the need to be manipulated by a cryogen expert, since it does not need any cryogenic liquid as it the case in the previous art device.

Furthermore, since the cold power is brought by the solid thermal link and the RF coil holder which are in the vacuum chamber, the measurement surface does not have to be reduced as it is the case in solution (i) and (ii).

From other aspect of the invention, the invention also relates to a method for tuning a resonance frequency of a RF coil for a Magnetic Resonance Measurement System, the RF coil being made into a high temperature superconductor, the method comprising the step of:

providing a RF coil holder for holding the RF coil, a cold source thermally linked to the RF coil holder, and a heat source thermally linked to the RF coil holder, each one of the cold source, the heat source, the RF coil holder is made of non-magnetic materials, arranging the RF coil on the RF coil holder into the Magnetic Resonance Measurement system, applying cold from the cold source to the coil holder in order to reduce the RF coil temperature below a critical temperature of the superconductor and configuring the Magnetic Resonance Measurement System, while cold is still applied and the Magnetic Resonance Measurement System being configured, tuning the resonance frequency of a RF coil by increasing the temperature of the RF coil using the heat source.

With such method, it is possible to achieve the tuning of the resonance frequency of a RF coil easily since the temperature could be control finely using the heat source. Furthermore, the method does not required the use of cryogenic liquids since it is possible any cold source, such as a cryocooler, that allow to cool the RF coil below the critical temperature of the superconductor.

This method is particularly advantageous regarding the method of the previous art, such as the one of teaches by Lambert, S et al. teaches, from their work published in the scientific journal "Review of Scientific Instruments" Vol. 84, p.p. 054701.

It is to note, that according to a preferably possibility of the invention, the method further includes the following step:

determining an approximate temperature for which the resonance frequency of the RF coil is tuned, wherein, the step of tuning of the resonance of the frequency of a RF coil is performed when the temperature of the RF coil is below the determined approximate temperature.

by "approximate temperature" for which the resonance of frequency of the RF coil is tuned, it is to understand that the approximate temperature determined is a temperature that is included in a range between +5 K and −5 K of the actual temperature for which the resonance frequency of the RF coil is tuned, this temperature being preferably included in a range between +2 K and −2 K of the actual temperature for which the resonance frequency of the RF coil is tuned.

This determination could either be done base on the characteristic value of the RF coil or on a measure of the resonance frequency of the RF coil during the decreasing of the RF coil temperature while cold is applied by using the cold source.

It is to note, that according to another preferably possibility of the invention, the method further includes the following step:

recording the resonance frequency of the RF coil during the cold is applied to the RF coil by the cold source, wherein, the step of tuning of the resonance of the frequency of a RF coil is performed when the resonance of the RF coil is within a predetermined range including a resonance frequency to achieve.

During the step of tuning the resonance frequency of the RF coil, the heat applied using the heat source could be control using a feedback loop based on a measurement signal from the Magnetic Resonance Measurement System.

The heat source could include a resistive film heater provided with a supporting part supporting the RF coil holder, the supporting part providing a thermal link between the film heater and the RF coil holder.

The cold source could be a cryocooler.

The Magnetic Resonance Measurement System could be a Magnetic Resonance imaging Scanner.

The invention also relates on a cryogenic device for adjusting the resonance frequency a RF coil for a Magnetic Resonance measurement system, the cryogenic device comprising:

a cold source, a heat source, a RF coil holder for holding the RF coil, the RF coil holder being in thermal link with both the cold source and the heat source, and a control unit configured to control the heat applied by the heat source, wherein each one of the cold source, the heat source, the solid thermal link, the RF coil holder and the measurement surface is made of non-magnetic materials.

BRIEF DESCRIPTION OF THE DRAWINGS

The present invention will be better understood with the reading of the specification of a furnished embodiment which does not limit the scope of the invention. This specification refers to the annexed drawings in which.

Same or similar parts in the different drawings use the same numerical reference to make easier the passage from one drawing to another.

DETAILED PRESENTATION OF PARTICULAR EMBODIMENTS

Figure 1:
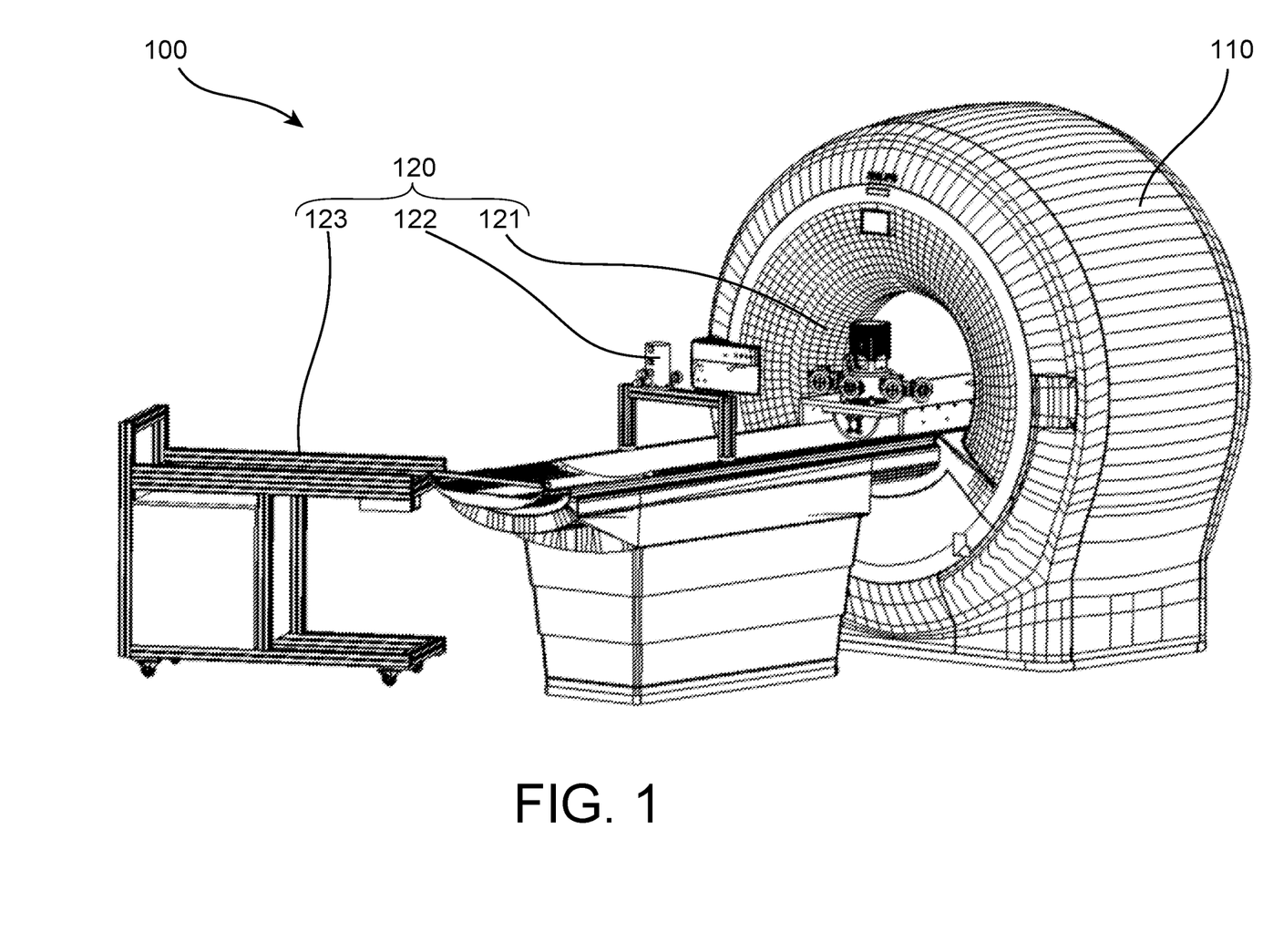
FIG. 1 shows an MRI assembly according to the invention.

FIG. 1 shows an MRI assembly 100 according to the invention which includes a cryogenic device 120, a RF-coil 130, not shown on FIG. 1 (see FIG. 4), and the MRI scanner 110. Such cryogenic device 120 is adapted in order to be partly housed into a magnet of the MRI scanner.

The inventors and their coauthor already have discussed the principle of such cryogenic device in an article published in the journal "*IOP Conference Series: Materials Science and Engineering*" Volume 278 number 1 pages 012122 with the title "*conceptual design of a cryogen free µMRI device*". The content of this article is incorporated by reference in this document.

Figure 2:
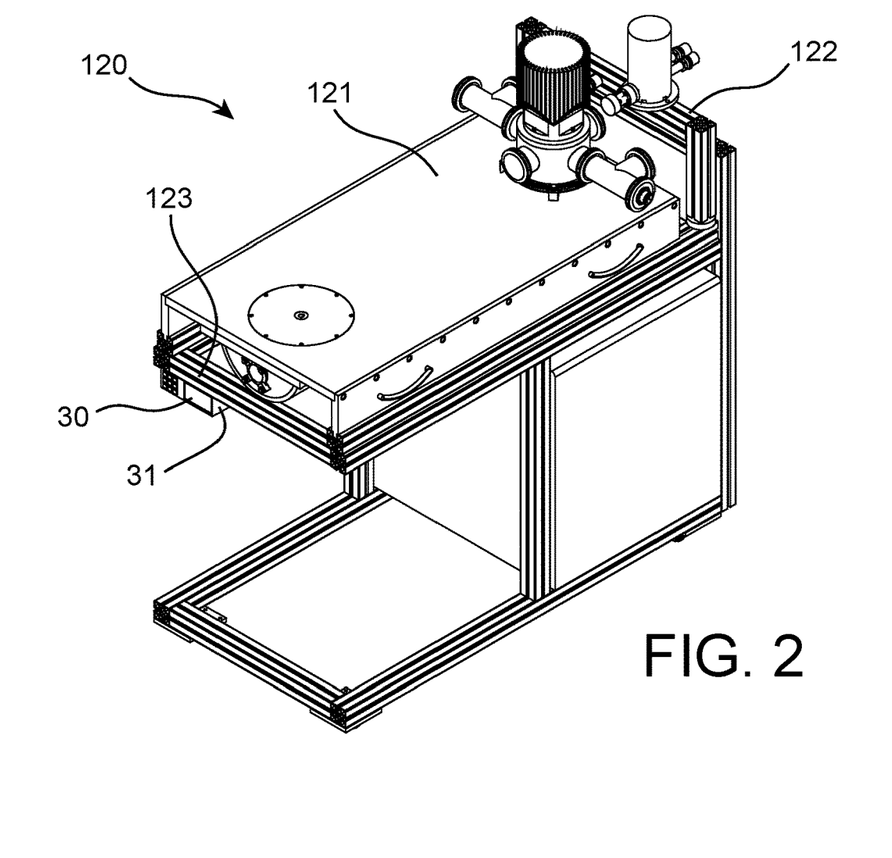
FIG. 2 shows a cryogenic device of the MRI assembly of FIG. 1.

Such cryogenic device 120 comprises, as shown on FIG. 2:

a cryostat 121 configured to apply the cold temperature to the RF coil and to provide a measurement surface on which the object to be scanned could be placed, a cryocooler 122 for providing a cold source, a heater, not shown, for providing a heat source, a temperature control unit 30 for controlling the heating provided by the heater to the RF coil 130 in order to achieve the tuning of the resonance frequency of the RF coil 130, a carriage 123 for displacing the cryogenic device 120.

Figure 3:
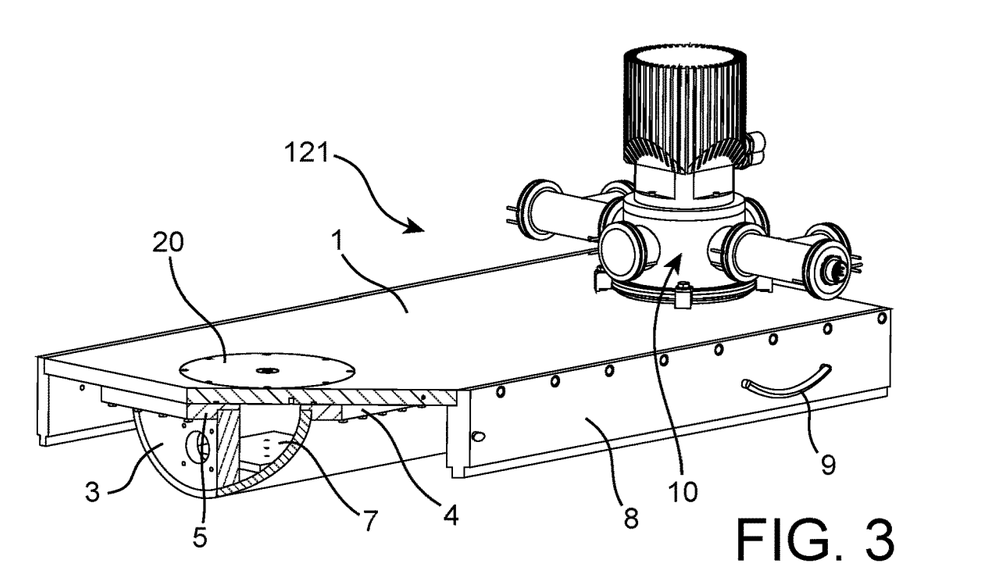
FIG. 3 shows a cryostat part of the cryogen device of FIG. 2.
Figure 4:
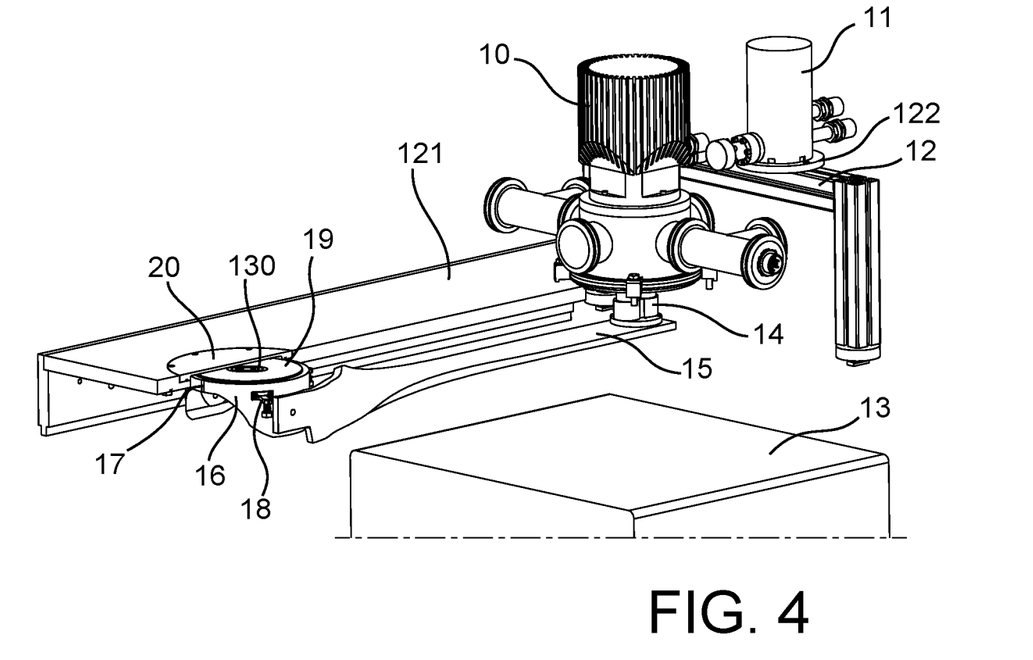
FIG. 4 shows a cooling part of the cryogen device of FIG. 2.

The cryostat 121 comprises as shown on FIG. 3:

a measurement table 1 on which will be placed the subject or the object to be imaged, the table including a measurement surface 20, a RF coil holder 19, shows on FIG. 4, the RF coil holder 19 being placed bellow the measurement surface 20 in order that the measurement surface facing the RF holder, a supporting part 16 for supporting the RF coil holder 19, a solid thermal link 15 comprising a first and a second end, the second end of the solid thermal link 15 being in thermal contact with the supporting part 16 and so, from the means if the support part 16, in thermal contact with the RF coil holder, the first end of the thermal link being in thermal contact with a cold finger of the cryocooler 122, a lower vacuum vessel 3, the lower vacuum vessel 3 forming, with the measurement table 1, a vacuum chamber housing the RF coil holder 19, the supporting part 16, the solid thermal link 15 and the cold finger of the cryocooler, a passive adsorption pumping surface made of active charcoal is placed on the cold parts, i.e. the solid thermal link 15 and the supporting part 16.

In order to allow the MRI measurement, all the above different parts of the cryostat 121 are magnetic material free.

The measurement table 1 comprises an upper plate on which the subject or object to be imaged will be placed. The measurement table 1 comprises also lateral walls 8 assembled on each side of the upper plate in order to allow the installation of the measurement table 1 on the MRI scanner 110 bed and provide the space between the upper plate and the MRI bed for housing the vacuum chamber. In order to allow an easy handling of the measurement table 1, each lateral walls is provided with handle 9.

The measurement table 1 must be mechanically designed to support the cryocooler 122, the RF coil and the subject or object to be imaged. The measurement table 1 has, on the upper plate, a first and a second opening and is configured to sustain vacuum (at least less than $10^{-4}$ mbar, preferably less than $10^{-6}$ mbar) inside. The measurement table 1 could be made, for example, of Polyether-ether-ketone (also known as PEEK). Such material of the measurement table 1 is particularly advantageous since it is provided with acceptable mechanical properties, the Young's modulus being of 4400 MPa, a rather low out-gasing and low permeation value.

The upper plate of the measurement table 1 is provided with the first opening for the measurement surface 20. The measurement surface 20 is removably mounted on the rest of the measurement table 1, in order to provide access to the HF coil. Similarly, to the rest of the measurement table 1 the measurement surface 20 could be made of Polyether ether ketone (also known as PEEK). According to a first possibility of the invention, the measurement surface 20 could be arranged with a single well configuration to enclose a single central RF coil 130 together with the RF coil holder 19. The distance from the upper surface of the measurement surface 20 to the RF coil, and so to the RF coil holder 19, is between 1 and 3 mm and preferably around 1.5 mm. According to a second possibility of the invention, the measurement surface 20 could be arranged in a multiple wells configuration to enclose a plurality of RF coils together with the RF coil holder 19. The distance from the upper surface of the measurement surface 20 to the RF coils, and so to the RF coil holder 19, is between 3 and 7 mm and preferably around 5 mm.

As shown on FIG. 3, a removably mounting of the measurement surface 20 on the rest of the measurement table 1 could be achieved by screwing the measurement surface 20 on the rest of the measurement table 1 using non-magnetic screws. The measurement surface 20 could be provided with an elastomer seal, not shown, for avoiding vacuum leakage.

As shown on FIG. 4, the RF coil holder 19 and the supporting part 16 are mounting on the lower face of the measurement table 1 using attachments 18 in non-magnetic material that provides thermal isolation. The attachment 18 is configured in order to press the RF holder 19 on the supporting part 16 to achieve a good thermal contact between the RF holder 10 and the supporting part 16.

The RF holder 19 is made of a material with a good thermal conduction, which has a high strength and must be dielectric in order to avoid electro-magnetic effects on the RF coil. Such properties could be obtained, for example, with a RF holder in sapphire since the sapphire has a thermal conduction of 1000 W/(m·K) at 77 K. The RF holder could be of a disk form.

In order to allow heating of the RF coil 130, the supporting part 16 is provided with the heater. In an advantageous configuration, the heater includes a film heater such as a polyamide insulated film heater, as the ones commercialized by Omega™ Company.

From another possibility of the invention, the film heater, according to its power, could be attached anywhere along the thermal link 15 going from the cryocooler 122 to the supporting part 16.

With such configurations of the heater, the heater is thermally linked to the RF Coil holder 19 by the means of the supporting part 16 or of the supporting part/thermal link.

The supporting part 16 is made of a material having a good thermal conduction and a magnetic permittivity, such as copper Cu or pure aluminum. Preferably, the supporting part 16 is made of copper since it is easier with copper to provide an advantageous symmetrical shape for the supporting part 16. The supporting part 16 has preferably a cylindrical shape cut in half along its height in order to avoid Eddy currents during the emission phase of the RF magnetic field and the image perturbation that such eddy currents can cause. In order to limit the electromagnetic perturbation during the emission phase, the supporting part 16 has preferably an inner diameter superior than 200 mm.

Both halves of the supporting part 16 are joined together using a non-magnetic and dielectric material 17, the material being preferably a thermal insulator. This non-magnetic and dielectric material 17 used to join the halves of the supporting part 16 could be made of glass fiber.

The supporting part 16 is in thermal contact with the solid thermal link 15. The solid thermal link 15 could be a thermal aluminum link. More precisely, the solid thermal link could comprised several rectangular sheets of high purity aluminum. The solid thermal link 15 is separated into two parts to surround the supporting part 16 and connect individually each of the halves of the supporting part 16. On the cryocooler 122 cold finger 14 both parts of the solid thermal link 15 are tight together and are in a horizontal position. In the middle of the length they are 90° twisted and separated to reach the supporting part 16 in vertical position. The solid thermal link is clamped to the supporting part 16 to achieve a good thermal contact. For example, the length of the aluminum part could be between 30 and 200 cm, preferably between 50 and 100 cm and could be around 75 cm. The solid thermal link could be more precisely, and by example, made of a 6N aluminum which has a thermal conductivity of 424 W/(m·K) at 77 K.

As a variant, the solid thermal link 15 could also be provided by one or many thermal conductors with a rod shape or a braided of metallic wires. In another variant the thermal link could be made of copper Cu.

The solid thermal link 15 has its first end in thermal contact with the cold finger 14 of the cryocooler 122.

In order to reduce the thermal losses during the cold transfer between the cryocooler 122 and the RF coil holder 19, the cold finger 14, the solid thermal link 15, the supporting part 16 and the RF holder 19 are housed in the vacuum chamber with a vacuum at least less than $10^{-4}$ mbar, preferably less than $10^{-6}$ mbar. The vacuum chamber is provided by the assembling of the measurement table 1 and of the lower vacuum vessel 3.

As shown on FIG. 3, the lower vacuum vessel 3 has a half cylindrical shape following preferably the curve of the bed of the MRI scanner 110. The lower vacuum vessel 3 could be made of a polychlorotrifluoroethylene (also known from its acronym PCTFE) that provides good machining properties and proven weldability. In order to reduce the maximal deformation of lower vacuum vessel 3 during vacuum pumping reinforcement ribs could be provided in the inner surface of the vacuum vessel 3.

The lower vacuum vessel 3 is mounted on the measurement table 1 using flange 4, non-magnetic screws 5 and an elastomer seal to ensure that the lower vacuum vessel 3 and the measurement table 1 assembly is vacuum tight.

As a possibility of the invention, the lower vacuum vessel 3 is provided with an accessory deck 7 in order to add accessories to the cryogenic device 100. Furthermore, in order to allow the pumping of the vacuum chamber, the lower vacuum vessel comprises a connector adapted to be connected to an external active pump.

The cold finger 122 of the cryocooler 122 is introduced in the vacuum chamber formed by the measurement table 1 and the lower vacuum vessel 3 through the second opening of the measurement table 1.

The cryocooler 122 could be one of a Stirling-type cooler, a Gifford-McMahon cooler, a pulse tube cooler and a Joule-Thomson cooler. In the present embodiment, a pulse tube cooler system has been chosen, in order to reduce to the minimum the vibration transmission to the MRI scanner. In any case, in order to reduce the vibration transition, the moving part, as the motorized valve 11 of a pulse tube cooler system, is adapted in order to be deported from the non-moving part of the cryocooler 122.

So, in the present embodiment, the cryocooler is a pulse tube cooler system. The pulse tube cooler system includes:
the pulse tube cooler 10 including the cold finger 14,
a motorized valve 11 that is connected to the pulse tube cooler 10,
an individual support 12 for supporting the motorized valve 11 in order to place the motorized valve 11 away from the magnet of the MRI scanner 110 for reducing the effect of the large magnetic field of the MRI scanner 110 on the motor of the motorized valve 11.

As for the cryostat 121, in order to allow the MRI measurement, all the above different parts of the cryocooler 122 are non-magnetic materials.

Furthermore, the pulse tube cooler 10 also includes a compressor 13 in order to provide high pressurized helium to the motorized valve 11 as required by the pulse tube cooling principle.

The compressor 13 could be mounted on the carriage 123. The carriage 123 could comprise, as shown on FIG. 5:
a frame 21 with wheels 22,
on a lower part of the frame 21 a deck 23 for the compressor 13,
on an upper part of the frame 24, tracks for the measurement table 1 and the individual support 12, the upper part comprising an handle in order to easing the displacement of the carriage 123,
a housing 31 for the temperature control unit 30.

Figure 5:
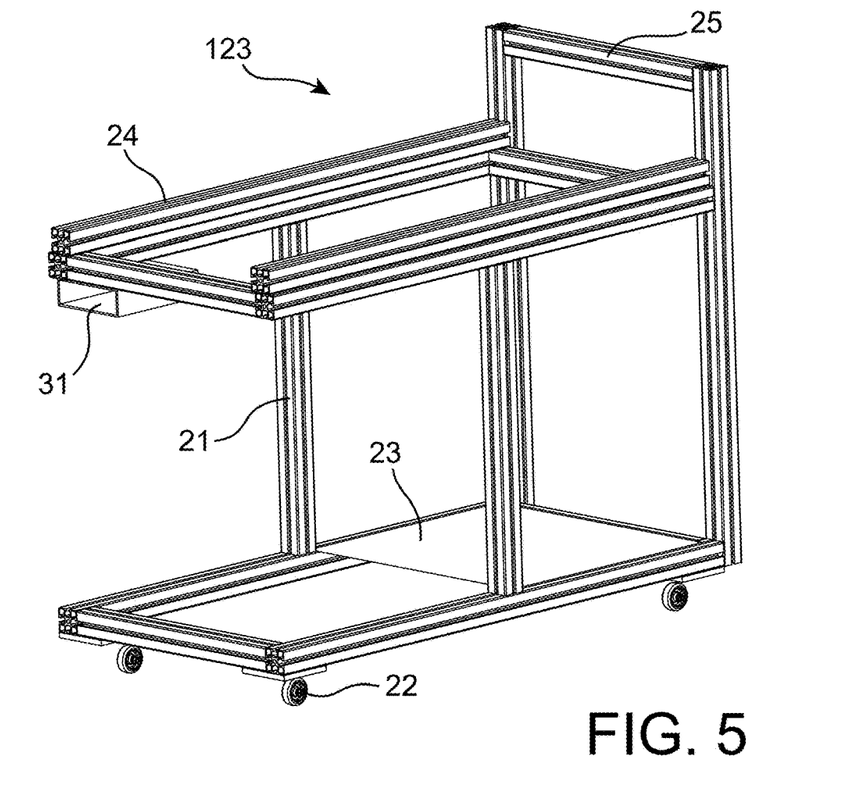
FIG. 5 shows a carriage of the cryogen device of FIG. 2.

The temperature control unit is configured to control the heat applied by the heater in order to achieve a tuning of the resonance frequency of the RF coil. So, preferably, the temperature control unit used a feedback loop based on a measurement signal from the Magnetic Resonance Measurement System. Such feedback loop could, for example, be based on the MRM signal on noise value (or Q-factor for quality factor), the temperature control unit 30 being configured to increase the Q-factor by modifying the heat applied by the heater on the RF coil 130.

As for the cryostat 121 and the cryocooler 122, in order to allow the MRI measurement, all the above different parts of the carriage 123 are non-magnetic materials.

With such cryogenic device it is possible to carry out MRI imaging using superconductor RF coil, such as $YBa_2Cu_3O_7$ RF coil, at HTcS using the following measurement method:
providing the cryogenic device 120, the RF coil, and the MRI scanner 110,
installing the RF coil on the RF coil holder 19,
closing the surface measurement 20 in order to close the vacuum chamber,
pumping the vacuum chamber using an external active pump to the connector of the lower vacuum vessel 3,
connecting the compressor 13 to the motorized valve 11,
switching on the compressor 13 in order to cool down the RF coil holder 19 and the RF coil,
stopping and disconnecting the external active pump,
stopping and disconnecting the compressor 13,
installing the cryostat 121 on the MRI scanner 110, the measurement surface 20 being housed into the magnet of the MRI scanner 110, the motorized valve 11 being mounted, thanks to the individual support 12 away from the magnet of the MRI scanner 110,
connecting the compressor 13,
Switching on again the compressor 13 in order to cool down the RF coil holder 19 and the RF coil,
configuring the MRI scanner 100,
while cold is still applied and the MRI scanner 100 being configured, tuning the resonance frequency of a RF coil 130 by increasing the temperature of the RF coil 130 using the heater, the heater being control using a feedback loop of the temperature control unit 30 based on a measurement signal from the MRI scanner,
placing the subject or the object to be imaged onto the measurement surface,
carrying the MRI imaging.

It can be note that according to possibilities of the invention:
(i) the method can further include a determining step of an approximate temperature for which the resonance frequency of the RF coil is tuned, and the step of tuning of the resonance of the frequency of a RF coil being performed when the temperature of the RF coil is below the determined approximate temperature;
(ii) the method can further include a recording step of the resonance frequency of the RF coil during the cold is applied to the RF coil by the cold source, and the step of tuning of the resonance of the frequency of a RF coil being performed when the resonance of the RF coil is within a predetermined range including a resonance frequency to achieved.

Regarding possibility (i) The determination of the approximate temperature for which the resonance frequency of the RF coil is tuned could either be done based on the characteristic value of the RF coil or on a measure of the resonance frequency of the RF coil during the decreasing of the RF coil temperature while cold is applied by using the cold source.

In an example of tuning a resonance frequency of a RF coil that could be achieved using the method of the invention, the inventors have used an the RF coil resonance that at Earth field and at 60K temperature (without applying heat by the heater), has an Q factor of around 5500 with a resonance frequency $f_0$ at 63.636250 MHz (band width of 1 Hz). The Q-factor decreased to 3000 and $f_0$=63.899313 MHz when applying a magnetic field $B_0$ of 1.5 T by the MRI scanner. By tuning the RF coil frequency using the heater, it has been possible to compensate the $f_0$ shift due to the $B_0$-field and finally retune the RF coil to the Larmor frequency.

With such fine tuning of the resonance frequency of the RF coil, the inventors has achieved detection the spin w response at the resonance frequency up to a distance of 1 mm from the RF coil. The resulting MR image obtained using such configuration is illustrated on FIGS. 6A and 6B.

Figure 6A:
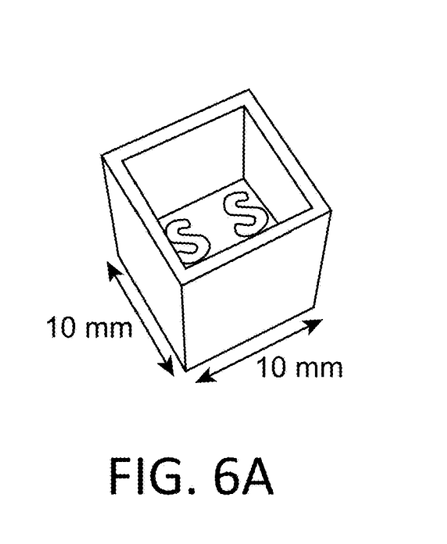
FIGS. 6A and 6B show, on FIG. 6A, a plastic sample used to illustrate the resolution measurement of a MRI setup using a RF coil tuned with a method of the invention and, on FIG. 6B, a measurement picture of this sample obtained with such MRI setup.
Figure 6B:
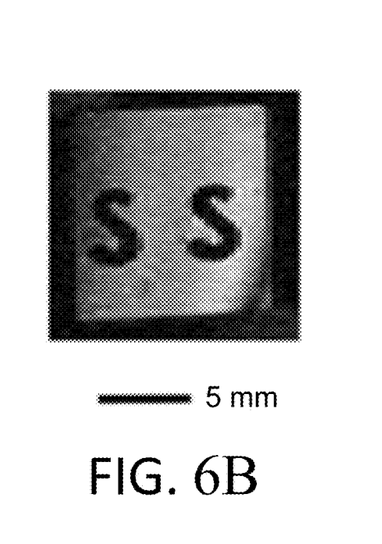

FIG. 6A shows a sample plastic cubic ($10\times10\times15$ $mm^3$) containing water doped with gadolinium (C=0.00125 mmol/ mL, T1=0.2 sec) that was placed into the MR scanner. This plastic cubic is representing a double S logo. The distance between the RF coil and the plastic cubic was around 2 mm. The resulting MRI image of the plastic cubic is shown on FIG. 6B. This MR image of the plastic cubic along the three planes has been achieved with a spatial resolution of 100 µm$^3$ thanks to the tuning method of the invention.

Of course and according to other aspects of the invention, if in this embodiment of the invention, the invention method is carried out on a MRI system, the skilled man in the art is abled, using the teaching of this document, to carry out the invention method on other type of Magnetic Resonance Measurement System such as Nuclear Magnetic Resonance system.

The invention claimed is:

1. A cryogenic device for cooling a RF coil for a Magnetic Resonance Imaging system, the cryogenic device comprising:
   a cryocooler providing a cold source,
   a solid thermal link, the solid thermal link having first end in thermal contact with the cryocooler,
   a RF coil holder for holding the RF coil, the RF coil holder being in thermal contact with a second end of the solid thermal link opposite to the first end,
   a vacuum chamber enclosing the solid thermal link and the RF-coil holder,
   a measurement surface facing the RF coil holder,
   a heating source, and
   a controller configured to control heat applied by the heating source,
   wherein each one of the cryocooler, the solid thermal link, the RF coil holder, the heating source, and the measurement surface is made of non-magnetic materials, and
   wherein the controller is configured to control the heat applied by the heating source using a feedback loop based on a Magnetic Resonance measurement signal from a Magnetic Resonance Imaging scanner.

2. The cryogenic device according claim 1, wherein the cryocooler is a pulse tube cryocooler system.

3. The cryogenic device according to claim 2,
   wherein the pulse tube cryocooler system includes two parts, one part being the pulse tube cryocooler and the other part being a motorized valve,
   wherein the cryogenic comprises a compressor, the compressor being connected to the pulse tube cryocooler by the means of the motorized valve, and
   wherein the cryocooler and the motorized valve are distant from each other.

4. The cryogenic device according to claim 3, wherein the cryocooler and the motorized valve are connected using a first flexible connection.

5. The cryogenic device according to claim 4,
   wherein the cryogenic device comprises a carriage, the carriage being arranged in such way it can carry the cryocooler, the cryostat, the RF coil holder, and the compressor, and
   wherein the compressor is mounted on the carriage, the compressor being connected to the motorized valve with a second flexible connection.

6. The cryogenic device according to claim 1, wherein the cryogenic device comprises a passive pumping system of the vacuum chamber.

7. The cryogenic device according to claim 4, wherein the passive pumping system is an adsorption pumping surface made of active charcoal.

8. The cryogenic device according to claim 1, wherein the solid thermal link is made of a plurality of metal sheets.

9. The cryogenic device according to claim 1, wherein the solid thermal link is made of a plurality of pure aluminum sheets.

10. The cryogenic device according to claim 1, wherein the solid thermal link and the RF coil holder are in thermal contact by the means of a support part.

11. The cryogenic device according to claim 10, wherein the support part is made at least partially in copper.

12. The cryogenic device according to claim 11, wherein the support part has a general cylinder shape and comprised at least two parts.

13. The cryogenic device according to claim 1, wherein the heat source includes a resistive film heater provided with a supporting part supporting the RF coil holder, the supporting part providing a thermal link between the film heater and the RF coil holder.

14. A Magnetic Resonance Imaging assembly comprising:
   the Magnetic Resonance Imaging scanner,
   a RF coil, and
   the cryogenic device according to claim 1,
   wherein the RF coil is arranged on the RF coil holder facing the measurement surface.

15. Magnetic Resonance Imaging method comprising the step of:
   providing a magnetic resonance imaging assembly,
   applying cold to the RF coil using a cryogenic device,
   carrying out Magnetic Resonance Imaging using an RF coil of the magnetic imaging assembly, the RF coil being cooled by the cryogenic device,
   wherein the magnetic Resonance Imaging assembly comprises:
      a Magnetic Resonance Imaging scanner,
      the RF coil, and
      a cryogenic device,
   wherein the cryogenic device comprises:
      a cryocooler providing a cold source,
      a solid thermal link, the solid thermal link having first end in thermal contact with the cryocooler,
      a RF coil holder for holding the RF coil, the RF coil holder being in thermal contact with a second end of the solid thermal link opposite to the first end,
      a vacuum chamber enclosing the solid thermal link and the RF-coil holder,
      a measurement surface facing the RF coil holder,
      a heating source, and
      a controller configured to control the heat applied by the heating source,
   wherein each one of the cryocooler, the solid thermal link, the RF coil holder, the measurement surface, and the heating source is made of non-magnetic materials,
   wherein the controller is configured to control the heat applied by the heating source using a feedback loop based on a Magnetic Resonance measurement signal from the Magnetic Resonance Imaging scanner, and
   wherein the RF coil is arranged on the RF coil holder facing the measurement surface.

16. The Magnetic Resonance Imaging method according to claim 15, wherein the Magnetic Resonance Imaging method further includes, between the step of applying cold and the step of carrying out the Magnetic Resonance Imaging, the steps of:
   configuring the Magnetic Resonance Imaging scanner, and
   while cold is still applied and the Magnetic Resonance Measurement System is being configured, tuning a resonance frequency of the RF coil by increasing the temperature of the RF coil using the heat source.

\* \* \* \* \*